(12) United States Patent
Nirschl

(10) Patent No.: US 7,876,079 B2
(45) Date of Patent: Jan. 25, 2011

(54) SYSTEM AND METHOD FOR REGULATING A POWER SUPPLY

(75) Inventor: Thomas Nirschl, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/409,689

(22) Filed: Mar. 24, 2009

(65) Prior Publication Data

US 2010/0244791 A1    Sep. 30, 2010

(51) Int. Cl.
G05F 1/00 (2006.01)
G05F 3/02 (2006.01)

(52) U.S. Cl. .................... 323/283; 327/536

(58) Field of Classification Search .......... 323/273, 323/280, 282, 283, 351; 327/536
See application file for complete search history.

(56) References Cited

U.S. PATENT DOCUMENTS

| | | | |
|---|---|---|---|
| 6,424,121 B1 * | 7/2002 | Khouri et al. ............... 320/128 |
| 6,842,350 B2 * | 1/2005 | Yamada et al. ............ 363/21.16 |
| 7,402,962 B1 * | 7/2008 | Fong ........................... 315/299 |
| 2005/0073285 A1 * | 4/2005 | Schlaffer ..................... 323/229 |
| 2006/0085493 A1 * | 4/2006 | Kim et al. .................... 707/206 |
| 2006/0120198 A1 * | 6/2006 | Kubo ........................... 365/226 |
| 2006/0274579 A1 * | 12/2006 | Ha et al. .................. 365/185.18 |
| 2008/0055991 A1 * | 3/2008 | Kim et al. ............... 365/185.11 |

* cited by examiner

Primary Examiner—Adolf Berhane
Assistant Examiner—Emily Pham
(74) Attorney, Agent, or Firm—Slater & Matsil, L.L.P.

(57) ABSTRACT

In an embodiment, a method for controlling an output voltage of a power supply system is disclosed. The method includes regulating the power supply to a first voltage. After regulating the power supply to a first voltage, the power supply is regulated to a second voltage, which includes changing an input to the power supply system, and altering charge at an output of the power supply system until the output voltage reaches the second output voltage.

21 Claims, 4 Drawing Sheets

SYSTEM AND METHOD FOR REGULATING A POWER SUPPLY

TECHNICAL FIELD

The present invention relates generally to a system and method for regulating a power supply, and more particularly to a system and method for controlling a charge pump power supply.

BACKGROUND OF THE INVENTION

Non-volatile semiconductor memories, such as EEPROM, and flash memory, have become increasingly pervasive in many electronic applications, including flash drives, smart cards, and embedded systems. In order for such non-volatile memories to store data, however, high voltages are needed to write data. Generally, these high voltages are generated by charge pump based power supplies on the same integrated circuit as the memory array. Charge pump power supplies typically use capacitive boosting techniques to create on-chip programming voltages in excess of the externally applied power supply voltage.

In a typical non-volatile memory system, the same charge pump based power supply is used to generate the high voltages required to writing and erasing the memory array, and the lower voltages need to read the memory array. Because shrinking semiconductor geometries have created a corresponding decrease in the amount of voltage a standard semiconductor device can tolerate before breaking down or being destroyed, specially constructed high voltage devices are required whenever high on-chip voltages are used. These high voltage devices are generally larger, slower and less area efficient than lower voltage minimum geometry devices, so area efficient designs minimize the use of such high voltage devices. Consequently, the read circuits for non-volatile memory typically employ low voltage devices that cannot withstand high programming voltages.

In order to prevent damage and breakdown to low voltage devices after a read or erase cycle has been performed, conventional non-volatile memory systems typically discharge the output of the charge pump from its high voltage state to a standby voltage prior to generating a lower voltage. Recharging the output of a charge pump power supply takes time, however, typically in the range of 10 μs to 30 μs. In applications that require high speed, this time delay can slow down system performance. Furthermore, discharging and recharging a charge pump dissipates excess power and energy, which can be disadvantageous to low power applications.

What are needed are fast, power efficient circuits and methods to provide power to systems with multiple voltages larger than the supply voltage.

SUMMARY OF THE INVENTION

In an embodiment, a method for controlling an output voltage of a power supply system is disclosed. The method includes regulating the power supply to a first voltage. After regulating the power supply to a first voltage, the power supply is regulated to a second voltage, which includes changing an input to the power supply system, and altering charge at an output of the power supply system until the output voltage reaches the second output voltage.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to embodiments in a specific context, namely a charge pump power supply system for a non-volatile memory. The invention may also be applied in other contexts, such as general power supply systems.

Figure 1:
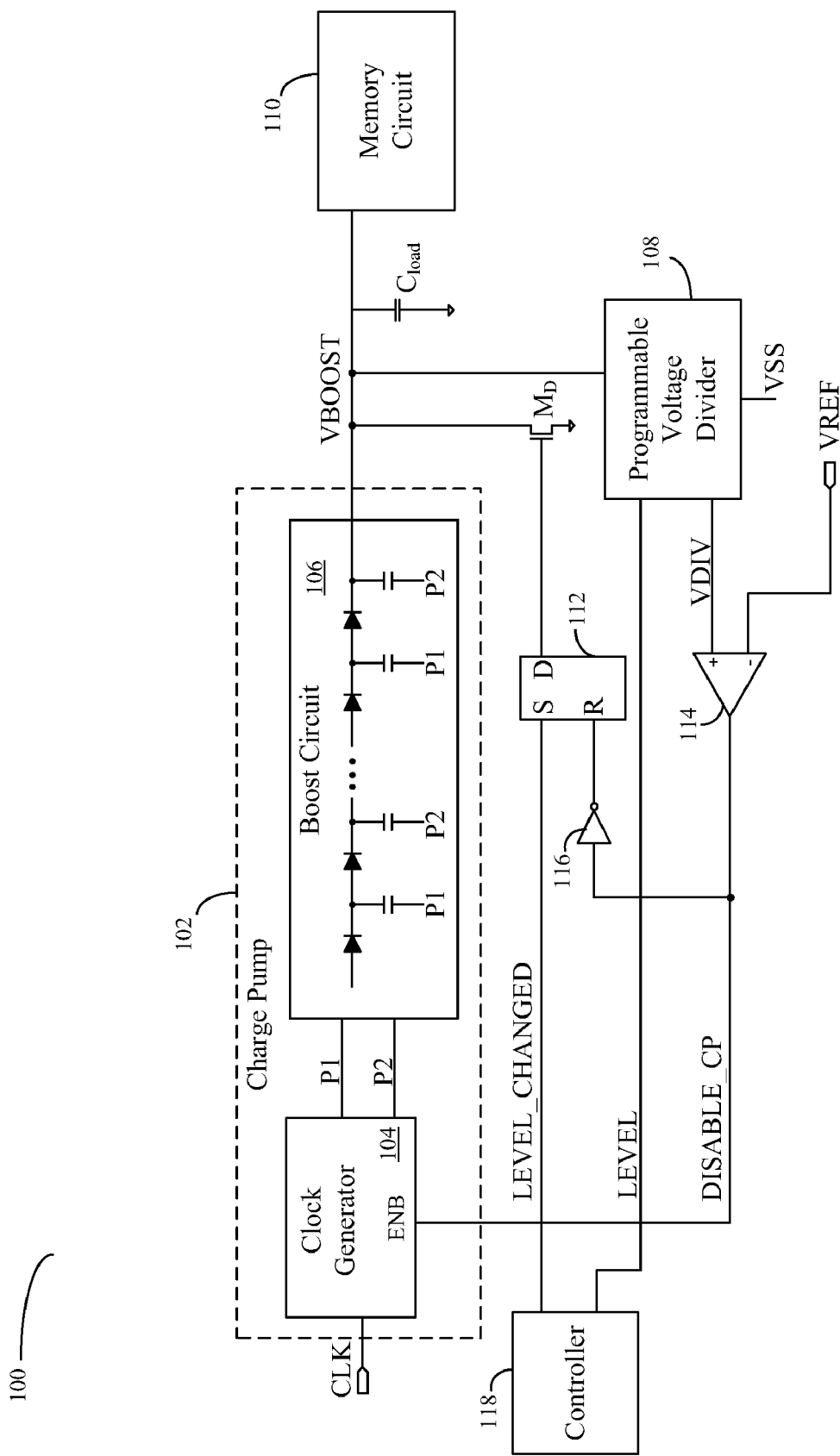
FIG. 1 illustrates an embodiment charge pump power supply system.

FIG. 1 illustrates embodiment power supply system 100 that supplies boosted voltage VBOOST to memory circuit 110. Alternatively, memory circuit 110 can be a load circuit. Power supply system 100 preferably includes charge pump 102, programmable voltage divider 108, comparator 114, latch 112 and controller 118. Capacitance $C_{load}$ represents the total output capacitance at VBOOST. In preferred embodiments, charge pump 102 is made from clock generator 104 and boost circuit 106. Clock generator 104 generates clocks P1 and P2 from input CLK signal CLK. These clocks P1 and P2 are used by boost circuit 106 to clock successive stages of a diode and capacitor array that generates output voltage VBOOST. The frequency of signal CLK is preferably between about 50 MHz and about 200 MHz, however, in alternative embodiments, other frequencies outside this range can be used. Charge pump 102, which is implemented according to conventional methods known in the art, is configured to provide output voltages between about 3V and about 20V. In alternative embodiments of the present invention, other charge pump or voltage boosting architectures can be used, and other output voltage ranges provided for. For example, instead of a charge pump, a switched-mode power supply can be used.

Charge pump 102 is activated by signal DISABLE_CP, which preferably enables and disables boost circuit 102 by gating clock signal CLK. In a preferred embodiment, phases P1 and P2 are active when DISABLE_CP is low, and inactive when DISABLE_CP is high. In alternative embodiments, this polarity may be reversed.

During operation of charge pump power supply system 100, output VBOOST is regulated by the feedback action of a control loop having programmable voltage divider 108 and comparator 114. In principle, the control loop activates charge pump 102 when VBOOST is below a target voltage, and deactivates charge pump 102 when VBOOST exceeds a target voltage. In preferred embodiments of the present invention, the target output voltage depends on the particular mode in which memory circuit 110 is operating. In embodiments employing non-volatile memories, such as EEPROM and flash, memory circuit 110 operates in a read mode, a write mode, and an erase mode. In the read mode, the target output voltage is between about 3V and about 10V. In write and erase modes, the target output voltage is between about 12V and about 20V. In alternative embodiments of the present invention, other output voltage ranges can be used.

In preferred embodiments of the present invention, VBOOST is regulated to a target output voltage by dividing the VBOOST down to a voltage within the compliance range of circuits powered by the normal non-boosted supply. This divided voltage is compared to a reference voltage, and a determination is made whether or not to activate the charge pump. In embodiments of the present invention, VBOOST is divided using programmable voltage divider 108 to produce voltage VDIV according to a voltage division ratio controlled by signal LEVEL. Signal LEVEL is preferably a 4 bit digital signal that sets the voltage division ratio of voltage divider 108. In alternative embodiments of the present invention, signal LEVEL may have different resolutions other than 4 bits and VDIV can have other relationships to VBOOST besides a simple ratio. For example, VDIV can be related to VBOOST by a divide ratio plus a constant. Programmable voltage divider 108 can be implemented using conventional techniques and architectures in embodiments of the present invention.

In preferred embodiments, divided output VDIV is compared to reference voltage VREF by comparator 114, which is architected according to techniques known in the art. The output of comparator 114 is signal DISABLE_CP, which controls the operation of charge pump 102. In the illustrated embodiment, when VDIV is greater than VREF, signal DISABLE_CP is high, thereby disabling charge pump 102. When VDIV is less than VREF, however, DISABLE_CP is low, and charge pump 102 is activated. It can be seen that in alternative embodiments of the present invention. DISABLE_CP and/or the enable input to clock generator 104 can have a different polarity.

When there is a mode change requiring an output voltage change from a higher output voltage to a lower output voltage, for example, from a write voltage of 12V to a read voltage of 5V, power supply system 100 discharges the output capacitance represented by $C_{load}$ until the voltage at VBOOST reaches the lower read voltage. In preferred embodiments of the present invention, $C_{load}$ is discharged by NMOS transistor $M_D$ whose gate is controlled by latch 112.

In preferred embodiments, a change in output voltage is affected by changing the value of signal LEVEL input to programmable voltage divider 108, which changes the division ratio of divider 108. To decrease the regulated voltage of VBOOST, the division ratio of the programmable voltage divider is changed from a higher division ratio to a lower division ratio. For example, if the voltage division ratio of the programmable divider is initially 1/12 and VREF is set to 1V, then the output at VBOOST is regulated to about 12V. If, however, the voltage division ratio is changed from 1/12 to 1/5, then VBOOST, will eventually be controlled to about 5V.

It can be seen, however, that in order for VBOOST to transition from a higher voltage to a lower voltage, output capacitance $C_{load}$ needs to be discharged. In embodiments of the present invention, $C_{load}$ is preferably on the order of about 100 pF in order to ensure that enough charge is available to memory circuit 110 during a write or erase operation without pulling VBOOST too low. In other embodiments, $C_{load}$ can assume other values, for example, between about 5 pF and about 100 pF depending on the application. Alternatively, $C_{load}$ can be above 100 pF or below 5 pF. Consequently, discharging $C_{load}$ through parasitic discharge paths in memory circuit 110 and/or programmable voltage divider 108 may take a considerable amount of time, for example up to about 1 ms. Furthermore, allowing $C_{load}$ to discharge through the operation of memory circuit 110 is problematic because the circuitry in memory circuit 110 may not be able to withstand the high write and erase voltages at VBOOST. Conventional art charge pumps have remedied this situation by completely discharging $C_{load}$ after a write or erase operation before the next operation. As explained hereinabove, discharging such a large capacitance dissipates power and the time that it takes to charge VBOOST from ground to a read voltage (i.e. about 10 μs to 30 μs) slows down operation of the memory system.

In preferred embodiments of the present invention, when the output of charge pump 102 transitions from a higher voltage to a lower voltage, $C_{load}$ is discharged through $M_D$ until the new target voltage is reached. In order to lower VBOOST from a higher voltage to a lower voltage in this manner, signal LEVEL_CHANGED is asserted when a lower voltage division ratio is selected via signal LEVEL. When LEVEL_CHANGED is asserted, latch 112 is set, thereby turning on transistor $M_D$, which causes $C_{load}$ to discharge. Once voltage VDIV falls below VREF, comparator 114 changes state and signal DISABLE_CP goes low and resets latch 112 though inverter 116. Once latch 112 is reset, the gate of transistor $M_D$ is brought low so that $C_{load}$ stops being discharged though $M_D$. In preferred embodiments of the present invention, LEVEL_CHANGED is asserted for a short period of time, for example two clock cycles, to ensure that latch 112 can be reset when DISABLE_CP goes low. Control of the timing of signals LEVEL and LEVEL_CHANGED is controlled by controller 118.

It should be appreciated that in alternative embodiments of the present invention, charge pump 102 can boost output VBOOST to a negative supply. In this case, discharge device $M_D$ is implemented as a PMOS device, and the polarity of comparator 114 is reversed so that charge pump 102 is activated when VDIV exceeds VREF. In embodiments with negative supplies, comparator 114 can be biased to operate at negative supply voltages and/or programmable resistor divider 108 can be biased to produce VDIV within the voltage compliance range of comparator 114 and the rest of the circuits of power supply system 100. For example, reference node VSS can be biased at a voltage greater than ground so that VDIV (and consequently VREF) have positive voltage values. In preferred embodiments of the present invention that produce negative voltage supplies, target output voltages are preferable between about −4V and about −12V. Alternatively, other output voltage ranges can be used depending on the particular application and its specifications.

Figure 2:
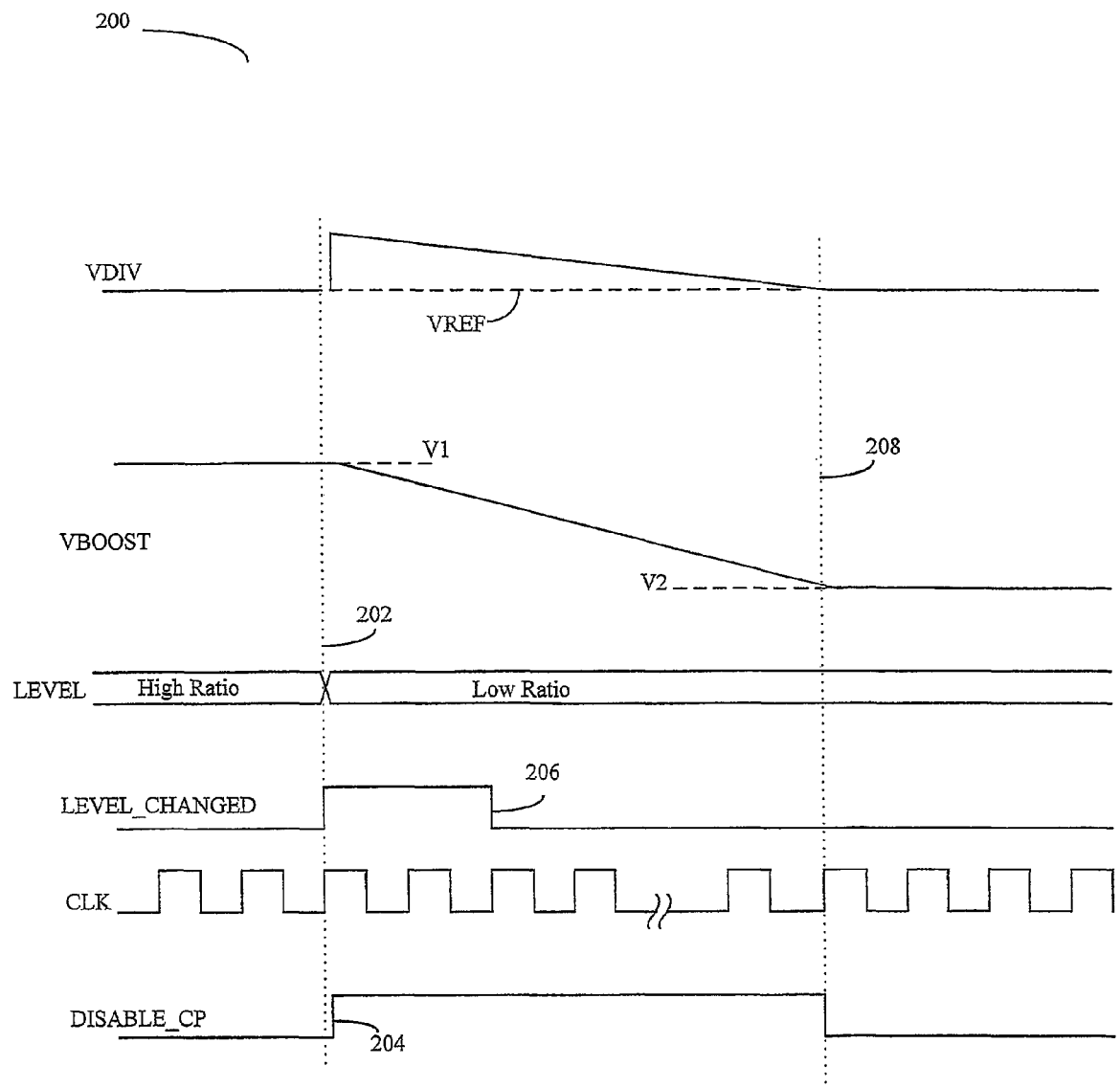
FIG. 2 illustrates a timing diagram of an embodiment charge pump power supply system.

Turning to FIG. 2, exemplary waveform 200 diagram of an embodiment of the present invention is shown, which illustrates a transition from a higher voltage to a lower voltage at VBOOST. VBOOST initially starts out at V1. At edge 202, signal LEVEL transitions from a high divide ratio and a low divide ratio and signal LEVEL_CHANGED is asserted.

Divided voltage VDIV is then driven higher than VREF because of the change in the voltage division ratio. A short time later, at time 204, the state of the comparator changes and VBOOST starts to discharge. Signal DISABLE_CP is also asserted, which turns off charge pump 102. For example, two clock cycles later, at edge 206, signal LEVEL_CHANGED is de-asserted to ensure that latch 112 (FIG. 1) resets properly. Once VDIV goes below VREF, which signifies that VBOOST has substantially reached its new target value of V2, the state of the comparator changes again, and DISABLE_CP is de-asserted. When DISABLE_CP goes low, latch 112 (FIG. 1) is reset, transistor $M_D$ is shut off, and VBOOST stops discharging. In preferred embodiments, the system will wait a defined number of clock cycles to allow VBOOST to discharge to its new value. For example, in one embodiment, the system waits 300 clock cycles for VBOOST to reach its final value. In alternative embodiments, the state machine or CPU controlling the timing can react interactively upon the charge pump having reached a new level.

Figure 3:
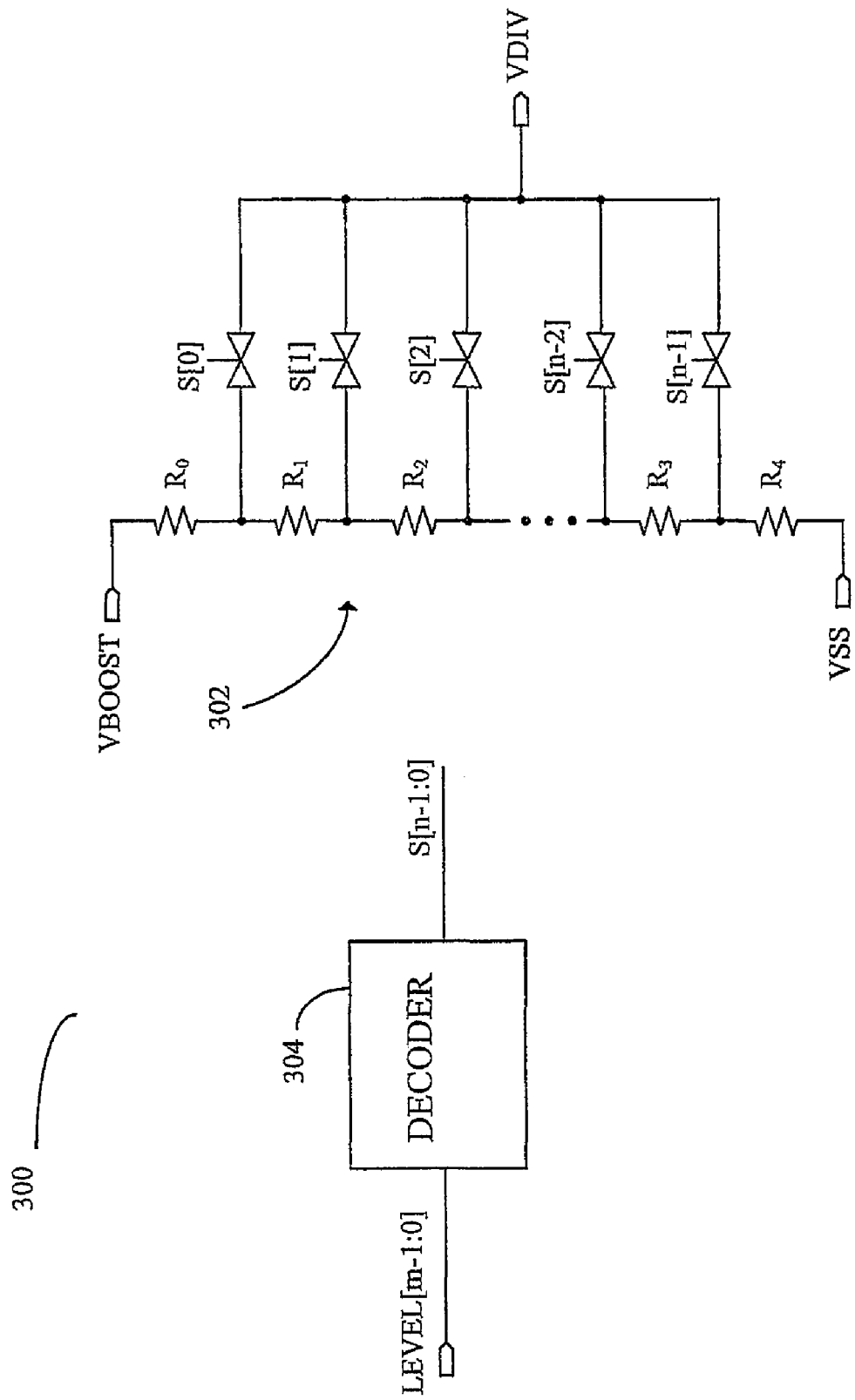
FIG. 3 illustrates and embodiment programmable voltage divider.

Turning to FIG. 3, and embodiment programmable voltage divider 300 is illustrated. Programmable voltage divider 300 has a resistor network 302 made of series resistors $R_0$ to $R_n$. Transmission gates TG0 to TG(n−1) are coupled between nodes on resistor network 302 and divided voltage output node VDIV. In preferred embodiments, transmission gates TG0 to TG(n−1) are implemented with CMOS transmission gates. In alternative embodiments, other switching methods can be used. Decoder 304 decodes m-bit division ratio signal LEVEL into signals S0 to S(n−1) to control transmission gates TG0 to TG(n−1). In preferred embodiments, signal LEVEL is a 4 bit binary word that is decoded into 16 switch signals. In alternative embodiments, other logical schemes can be used to generate switch signals S0 to S(n−1), for example, these signals can be generated by controller 118 (FIG. 1) directly.

Other voltage division structures and techniques can be used to generate divided voltage VDIV in alternative embodiments. For example, networks other circuit components such as capacitors, diodes and transistors can be used in place of resistor network 302. One such alternative method uses series connected MOSFETs and is described in U.S. patent application Ser. No. 10/970,363 filed on Oct. 24, 2004, entitled "Circuit Arrangement for Voltage Regulation," which application is hereby incorporated herein by reference.

Figure 4:
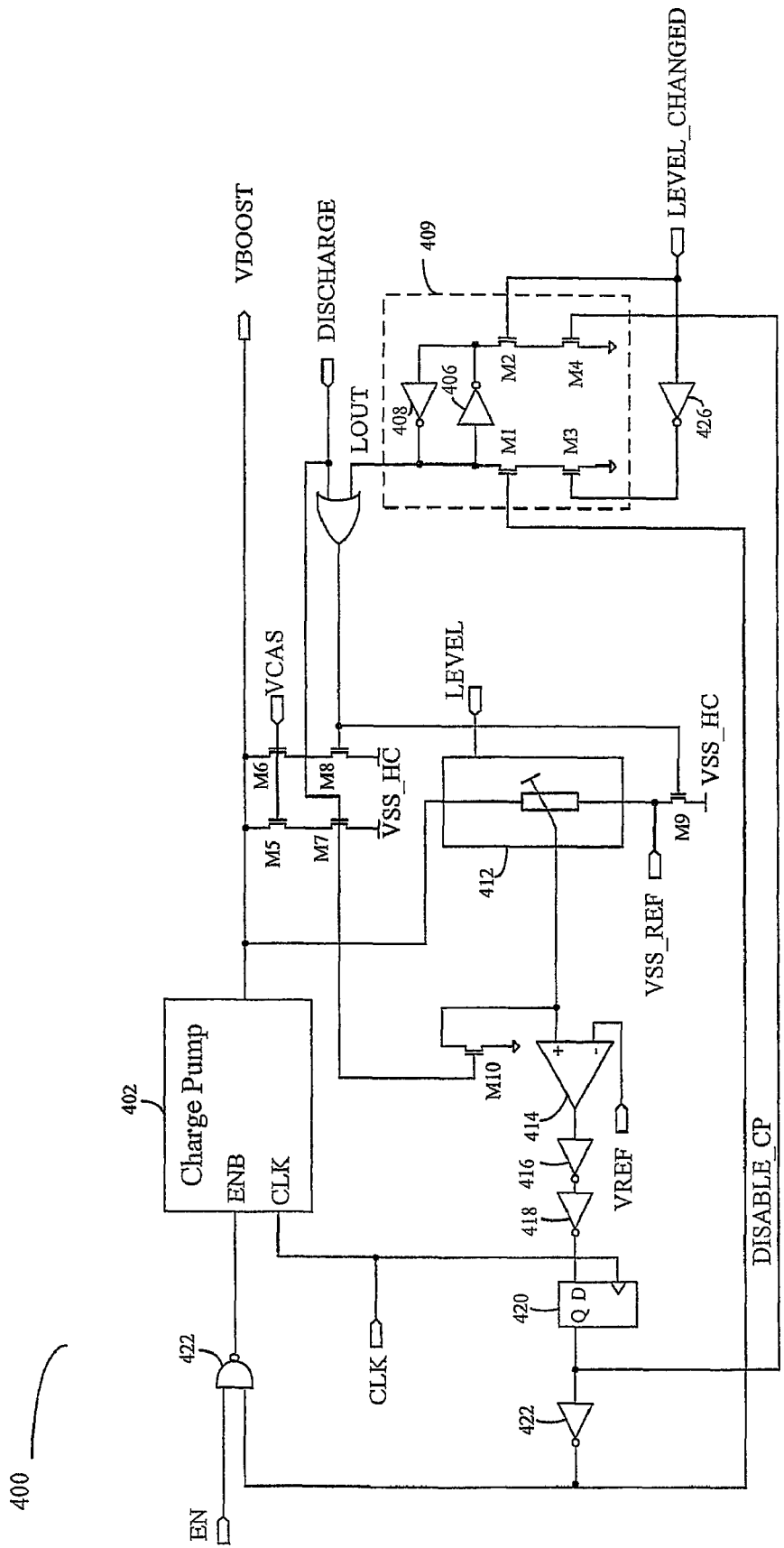
FIG. 4 illustrates an alternative embodiment charge pump power supply system.

Turning to FIG. 4, another embodiment charge pump power supply system 400 is illustrated. Power supply system 400 has charge pump 402, which is controlled by a feedback loop made of programmable resistor divider 412 and comparator 414. Unlike the embodiment of FIG. 1, the output of comparator 414 is buffered by inverters 416 and 418 and is registered by flip-flop 420 which runs on clock CLK and is synchronous with charge pump 402. Clocking the comparator of 414 ensures that all state transitions occur on a clock edge, and that that a slow and/or metastable condition at the output of comparator 414 does not cause the circuit to behave unpredictably. Also in the feedback loop is inverter 422 and NAND gate 424. Signal EN shuts down charge pump 402 when asserted.

When VBOOST is reduced in voltage, VBOOST is discharged by transistor M8, which is controlled by the output of OR gate 410. Cascode transistor M6 is preferably a high voltage device and is provided to protect transistor M8 from breakdown and damage. Alternatively, M6 can be a medium voltage or low voltage device depending on the particular system and its specifications. Voltage VCAS is preferably chosen to keep M8 from breaking down.

In an embodiment of the present invention, signal DISCHARGE is provided to override the output of latch 409 and externally discharge the output of charge pump 402. When DISCAHRGE goes high, the gate of M8 goes high via OR gate 410. Additional discharge transistor M7 connected in series with cascode transistor M5 is provided to more rapidly discharge the output of charge pump 402. M10, which is also coupled to signal DISCHARGE, is provided to ground the positive input of comparator 414. In embodiments of the present, signal DISCHARGE is asserted to place the charge pump in a low power and/or sleep mode.

In preferred embodiments of the present invention, VREF has a value of between about 0.4V and about 1V, preferably about 0.6V and is derived from a bandgap reference. Alternatively, other voltage level and other voltage reference generation techniques can be used. Signal VSS_REF is preferably coupled to a same quiet, low current reference ground used to generate VREF. When the output of charge pump 402 is being discharged however, transistor M9 is turned on, and some current through the voltage divider is shunted to high current ground VSS_HC in order to reduce transients on quiet ground VSS_REF.

Latch 409 is made of transistors M1, M2, M3 and M4 and back to back inverters 406 and 408. Transistors M1 and M3 are coupled in series with the input of inverter 406, and transistors M2 and M4 are coupled in series with the input of inverter 408. Signal LEVEL_CHANGED is coupled to the gate of M2, while an inverted version of LEVEL_CHANGED is supplied to the gate of M3 via inverter 426. Likewise, signal DISABLE_CP is coupled to the gate of M4 and inverted version of DISABLE_CP is supplied to the gate of M1 via inverter 422. It can be seen that output LOUT of latch 404 is set when LEVEL_CHANGED transitions from low to high, and that LOUT goes low when DISABLE_CP goes high. Two branches of transistors, one with M1 and M3, and the other with M2 and M4 are used with inverted signals to prevent appreciable DC current flow. In alternative embodiments of the present invention, other latch topologies can be used.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling an output voltage of a power supply system comprising a charge pump, the method comprising:
   regulating the output voltage to a first voltage, regulating the output to the first voltage comprising
      activating the charge pump when the output voltage crosses the first voltage in a first direction, and deactivating the charge pump when the output voltage crosses the first voltage in a second direction, the second direction opposite the first direction; and after regulating the output voltage to the first voltage, regulating the output voltage to a second voltage, regulating the output voltage to the second voltage comprising changing an input to the power supply system, and altering charge at an output of the power supply system until the output voltage reaches the second voltage, activating the charge pump when the output voltage crosses the second voltage in the first direction, and deactivating the charge pump when the output voltage crosses the second voltage in the second direction.

2. A method for controlling an output voltage of a power supply system comprising a charge pump, the method comprising:

regulating the output voltage to a first voltage, regulating the output to the first voltage comprising dividing the output voltage according to a first transformation;

forming a first divided voltage based on dividing the output voltage according to the first transformation, activating the charge pump when the first divided voltage crosses a reference voltage in a first direction, and deactivating the charge pump when the first divided voltage crosses the reference voltage in a second direction, the second direction opposite the first direction; and after regulating the output voltage to the first voltage, regulating the output voltage to a second voltage, regulating the output voltage to the second voltage comprising changing an input to the power supply system, altering charge at an output of the power supply system until the output voltage reaches the second voltage, and dividing the output voltage according to a second transformation, forming a second divided voltage based on dividing the output voltage according to the second transformation, activating the charge pump when the second divided voltage crosses the reference voltage in a first direction, and deactivating the charge pump when the second divided voltage crosses the reference voltage in the second direction; and altering charge further comprises altering charge until the second divided voltage crosses the reference voltage in the second direction.

3. The method of claim 2, wherein:
altering charge comprises discharging the output;
the first direction comprises a decrease in voltage; and
the second direction comprises an increase in voltage.

4. The method of claim 3, wherein discharging the output comprises activating a transistor coupled to the output.

5. The method of claim 2, wherein:
the first transformation comprises a first ratio;
forming the first divided voltage comprises setting a programmable voltage divider to a first setting corresponding to the first ratio; and
forming the second divided voltage comprises setting a programmable voltage divider to a second setting corresponding to a second ratio.

6. The method of claim 5, wherein the programmable voltage divider comprises a resistive divider coupled to the power supply output.

7. A power supply system comprising:
a charge pump comprising
a clock input,
an enable input, and
a supply output;
a programmable voltage divider comprising
a first input coupled to the charge pump supply output,
a second input coupled to a first reference voltage, and
a divided voltage output, and
a programming input configured to affect the divided voltage output;
a comparator comprising
a first input coupled to the divided voltage output,
a second input coupled to an input reference voltage,
an output coupled to the enable input of the charge pump; and
a discharge circuit coupled to the charge pump supply output comprising:
an activation input, and
a deactivation input coupled to the output of the comparator, wherein the discharge circuit is configured to
start discharging the charge pump supply output when the activation input changes state, and
stop discharging the charge pump supply output when the activation input changes state.

8. The system of claim 7, wherein
the programmable voltage divider comprises a plurality of voltage taps; and
the programmable voltage divider is configured to couple one of the plurality of voltage taps to the divided voltage output based on a value of the programming input.

9. The system of claim 8, further comprising a switch coupled between the second input of the programmable voltage divider and a second reference voltage, wherein:
the first reference voltage comprises a quiet ground reference;
the second reference voltage comprises a high current ground reference; and
the switch is configured couple the second input to the high current ground reference while the discharge circuit is discharging the charge pump supply output.

10. The system of claim 7, wherein the discharge circuit further comprises a transistor coupled to the charge pump supply output.

11. The system of claim 10, wherein:
the charge pump supply output is configured to output a positive voltage; and
the transistor comprises an NMOS transistor.

12. The system of claim 7, wherein the discharge circuit further comprises a latch.

13. The system of claim 7 further comprising a register coupled between the output of the comparator and the activation input.

14. The system of claim 13, wherein the charge pump is configured to supply read and write voltages to a non-volatile memory.

15. A semiconductor circuit comprising:
a charge pump power supply;
a programmable voltage divider coupled to an output of the charge pump power supply, the programmable voltage divider comprising an output configured to output a signal proportional to a voltage at the output of the charge pump power supply according to a ratio selectable by a programming input;

a comparator coupled to the output of the programmable voltage divider, the comparator comprising an output configured to change state when the output of the programmable voltage crosses a predetermined threshold;

a latch coupled to the output of the comparator, the latch configured to be set when a first external signal is asserted, and reset when the output of the comparator changes state from a first state to a second state;

a discharge circuit configured to discharge the output of the power supply when the latch is set; and a controller configured to activate the first external signal for a number of clock cycles when the programming input of the programmable voltage divider changes state.

16. The semiconductor circuit of claim 15, wherein the comparator is configured to transition from the first state to the second state when the output of the programmable voltage divider crosses the predetermined threshold in a negative direction.

17. The semiconductor circuit of claim 16, wherein the charge pump power supply is configured to be active when the comparator output of the comparator is in the second state.

18. The semiconductor circuit of claim 15, further comprising a memory coupled to the output of the charge pump power supply.

19. The semiconductor circuit of claim 15, wherein the memory comprises a non-volatile memory.

20. The semiconductor circuit of claim 15, wherein the voltage divider comprises a plurality of series connected diodes.

21. A semiconductor memory circuit comprising:
a memory circuit comprising a power input;
a charge boosted power supply comprising:
    an output coupled to the power input of the memory,
    a clock generator,
    an enable input, and
    a capacitive charge boost circuit;
a programmable voltage divider comprising:
    a first node coupled to the output of the charge boosted power supply;
    a programming input configured to set a voltage divider ratio;
    an output;
a comparator comprising
    a first input coupled the output of the programmable voltage divider;
    a second input coupled to a reference voltage;
    an output coupled to the enable input of the charge boosted power supply;
a latch comprising
    a first input coupled to the output of the comparator, and
    a second input coupled to a first external input; and
a transistor comprising
    an output node coupled to the output of the charge boosted power supply, and
    a control node coupled an output of the latch, wherein the transistor starts discharging the output of the charge boosted power supply when the second input of the latch changes state, and the transistor stops discharging the output of the charge boosted power supply when the first input changes state.

* * * * *